US008467158B2

(12) United States Patent
Tekletsadik et al.

(10) Patent No.: US 8,467,158 B2
(45) Date of Patent: Jun. 18, 2013

(54) TECHNIQUE FOR LIMITING TRANSMISSION OF FAULT CURRENT

(75) Inventors: Kasegn D. Tekletsadik, Middleton, MA (US); Roger B. Fish, Bedford, MA (US); Paul J. Murphy, Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 219 days.

(21) Appl. No.: 12/818,454

(22) Filed: Jun. 18, 2010

(65) Prior Publication Data

US 2010/0296208 A1  Nov. 25, 2010

Related U.S. Application Data

(60) Provisional application No. 61/220,825, filed on Jun. 26, 2009.

(51) Int. Cl.
*H02H 3/00* (2006.01)

(52) U.S. Cl.
USPC ............................................. 361/19; 361/62

(58) Field of Classification Search
USPC ............................................. 361/19, 62–69
See application file for complete search history.

(56) References Cited

U.S. PATENT DOCUMENTS

| 4,453,197 | A | * | 6/1984 | Burrage | 361/272 |
| 5,436,606 | A | | 7/1995 | Cottevieille et al. | |
| 5,617,280 | A | * | 4/1997 | Hara et al. | 361/19 |
| 5,986,536 | A | | 11/1999 | Ries et al. | |
| 6,570,747 | B1 | * | 5/2003 | Paul | 361/19 |
| 6,766,143 | B1 | * | 7/2004 | Beckwith | 455/66.1 |
| 2005/0073200 | A1 | * | 4/2005 | Divan et al. | 307/44 |
| 2010/0051437 | A1 | * | 3/2010 | Kruska et al. | 200/502 |

FOREIGN PATENT DOCUMENTS

| FR | 2730103 A1 | 8/1996 |
| JP | 1206827 A | 8/1989 |
| JP | 1206836 A | 8/1989 |
| JP | 2007274754 A | 10/2007 |

OTHER PUBLICATIONS

Noe, M. et al., Conceptual Design of a 110kV Resistive Superconducting Fault Current Limiter Using MCP-BSCCO 2212 Bulk Material, IEEE Transactions on Applied Superconductivity, vol. 17, No. 2, Jun. 2007, pp. 1784-1787, Los Alamitos, CA, U.S.

* cited by examiner

*Primary Examiner* — Danny Nguyen

(57) ABSTRACT

A new type of superconducting fault current limiter is disclosed, which can advantageously be used with high voltage transmission networks. The circuit is electrically connected to two terminals, which connect to the transmission network. The superconducting circuit is located within an enclosure or tank, which is electrically isolated from ground. Therefore, the voltage difference between the enclosure and the superconducting circuit, and between the enclosure and the terminals are significantly less than exist in current deployments. In some embodiments, the enclosure is electrically connected to one of the terminals, while in other embodiments, the enclosure is electrically isolated from the terminals. The circuit can be combined with other like circuits to address a wide range of current transmission network configurations.

14 Claims, 10 Drawing Sheets

TECHNIQUE FOR LIMITING TRANSMISSION OF FAULT CURRENT

This application claims priority of U.S. Provisional Patent Application Ser. No. 61/220,825, filed Jun. 26, 2009, the disclosure of which is incorporated herein by reference in its entirety.

FIELD

The present application relates to a technique for limiting transmission of fault current.

BACKGROUND

In electric power transmission and distribution networks, fault current conditions may occur. A fault current condition is an abrupt surge in the current flowing through the network caused by faults or short circuits in the network. Causes of the faults may include lightning striking the network, and downing and grounding of the transmission power lines due to severe weather or falling trees. When faults occur, a large load appears instantaneously. The network, in response, delivers a large amount of current (i.e. overcurrent) to this load or, in this case, the faults. This surge or fault current condition is undesirable as the condition may damage the network or equipments connected to the network. In particular, the network and the equipments connected thereto may burn or, in some cases, explode.

One of the systems used to protect power equipments from damages caused by fault currents is a circuit breaker. When a fault current is detected, the circuit breaker mechanically opens the circuit and disrupts the overcurrent from flowing.

Another system to limit the fault current is a superconducting fault current limiter ("SCFCL"). Generally, a SCFCL comprises a superconducting circuit that exhibits almost zero resistivity below critical temperature level $T_C$, critical magnetic field level $H_C$, and critical current level $I_C$. If at least one of the conditions is raised above the critical level, the circuit becomes quenched and exhibits resistivity.

During normal operation, superconducting circuit of SCFCL is maintained below $T_C$, $H_C$, and $I_C$. During fault, one or more the conditions is raised above the critical level $T_C$, $H_C$, and $I_C$. Instantaneously, the superconducting circuit in the SCFCL is quenched and its resistance surges, thereby limiting transmission of the fault current. Following some time delay and after the short circuit fault is cleared, $T_o$, $H_o$, and $I_o$ are returned to normal values and current is transmitted through the network and the SCFCL.

The superconducting fault current limiters used currently in power transmission network, although capable of limiting fault currents, are not adequate. For example, SCFCL are incapable of supporting high voltage transmission networks. In addition, conventional SCFCL requires large footprint due to its technical deficiencies. Accordingly, a new type of SCFCL is needed.

SUMMARY

New techniques for limiting transmission of fault current are disclosed. In one particular exemplary embodiment, the technique may be realized with a new type of apparatus for limiting transmission of fault current. The apparatus may comprise an enclosure electrically decoupled from ground, such that said enclosure is electrically isolated from ground potential; first and second terminals, at least one of which is electrically connected to one or more current carrying lines; and a first superconducting circuit contained in said enclosure, said first superconducting circuit electrically connected to said first and second terminals.

In accordance to another embodiment of this particular exemplary embodiment, said enclosure may comprise electrically insulating material.

Yet in accordance to another embodiment of this particular exemplary embodiment, said enclosure may be electrically conductive.

In accordance to further embodiment of this particular exemplary embodiment, said enclosure may be electrically isolated from said first and second terminals.

In accordance with additional embodiment of this particular exemplary embodiment, a first voltage is present at said first terminal and a second voltage is present at said second terminal and where said enclosure is at a voltage between said first and second voltages.

In accordance with yet additional embodiment of this particular exemplary embodiment, said enclosure is electrically connected to one of said first and second terminals.

In accordance with still another embodiment of this particular exemplary embodiment, the apparatus may further comprising a support for supporting said enclosure, said support positioned between said enclosure and ground, wherein said support electrically isolates said enclosure from ground.

In accordance with another embodiment of this particular exemplary embodiment, the apparatus may further comprise a coolant within said enclosure to maintain said superconducting circuit below a predetermined temperature.

Yet in accordance with another embodiment of this particular exemplary embodiment, the apparatus may further comprise a platform upon which said enclosure is supported, wherein said platform is electrically isolated from ground.

Still in accordance to another embodiment of this particular exemplary embodiment, the apparatus may further comprise a second enclosure; third and fourth terminals; and a second superconducting circuit contained in said second enclosure, said second superconducting circuit electrically connected to said third and fourth terminals, where said second enclosure is supported by said platform.

Yet in accordance to another embodiment of this particular exemplary embodiment, the apparatus may further comprise supports positioned between said enclosure and said platform to electrically isolate said enclosure and said second enclosure.

In accordance to further embodiment of this particular exemplary embodiment, said third and fourth terminals are each electrically connected to one or more current distribution lines.

In accordance with additional embodiment of this particular exemplary embodiment, said third terminal may be electrically connected to one of said first and second terminals.

In accordance with yet additional embodiment of this particular exemplary embodiment, the apparatus may further comprise third and fourth terminals, at least one of which is electrically connected to one or more current carrying lines; and a second superconducting circuit contained in said enclosure, said second superconducting circuit electrically connected to said third and fourth terminals.

In accordance with still another embodiment of this particular exemplary embodiment, the apparatus may further comprise fifth and sixth terminals, at least one of which is electrically connected to one or more current carrying lines; and a third superconducting circuit contained in said enclosure, said third superconducting circuit electrically connected to said fifth and sixth terminals.

In accordance with another embodiment of this particular exemplary embodiment, clearance length between the first superconducting circuit and the enclosure is less than 250 cm.

Yet in accordance with another embodiment of this particular exemplary embodiment, the clearance length between the first superconducting circuit and the enclosure is about 8-25 cm.

In another particular exemplary embodiment, the technique may be comprise electrically connecting first and second terminals to one or more current transmission lines; electrically connecting a superconducting circuit to said first and second terminals to provide a path through which fault current passes, wherein said superconducting circuit contained in an enclosure; and electrically isolating said enclosure from ground.

In accordance to another embodiment of this particular exemplary embodiment, the technique may further comprise electrically isolating said enclosure from said first and second terminals.

Yet in accordance to another embodiment of this particular exemplary embodiment, the technique may further comprising utilizing a conductive enclosure and electrically connecting said enclosure to one of said first and second terminals.

In another particular exemplary embodiment, the technique may be realized by a method comprising providing a circuit breaker, the circuit breaker comprising a housing and a plurality of bushing insulators, the housing being exposed to atmosphere, maintained at ground potential, and spaced apart from ground by a first vertical distance; and providing a fault current limiter electrically coupled to the circuit breaker, the fault current limiter comprising an enclosure, first and second terminals, and a first superconducting circuit contained in said enclosure and electrically coupled to said first and second terminals, where the enclosure is spaced apart from the ground by a second vertical distance, the second vertical distance being greater than the first vertical distance.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE FIGURES

In order to facilitate a fuller understanding of the present disclosure, reference is now made to the accompanying drawings. These figures may not necessarily be drawn to scale. In addition, these figures should not be construed as limiting the present disclosure, but are intended to be exemplary only.

DETAILED DESCRIPTION

Herein, several embodiments of a superconducting fault current limiter are introduced. Those of ordinary skill in art will recognize that the embodiments included in the present disclosure are for illustrative purpose only. For purpose of clarity and simplicity, parts, features, and functions already known may be omitted.

Figure 1A:
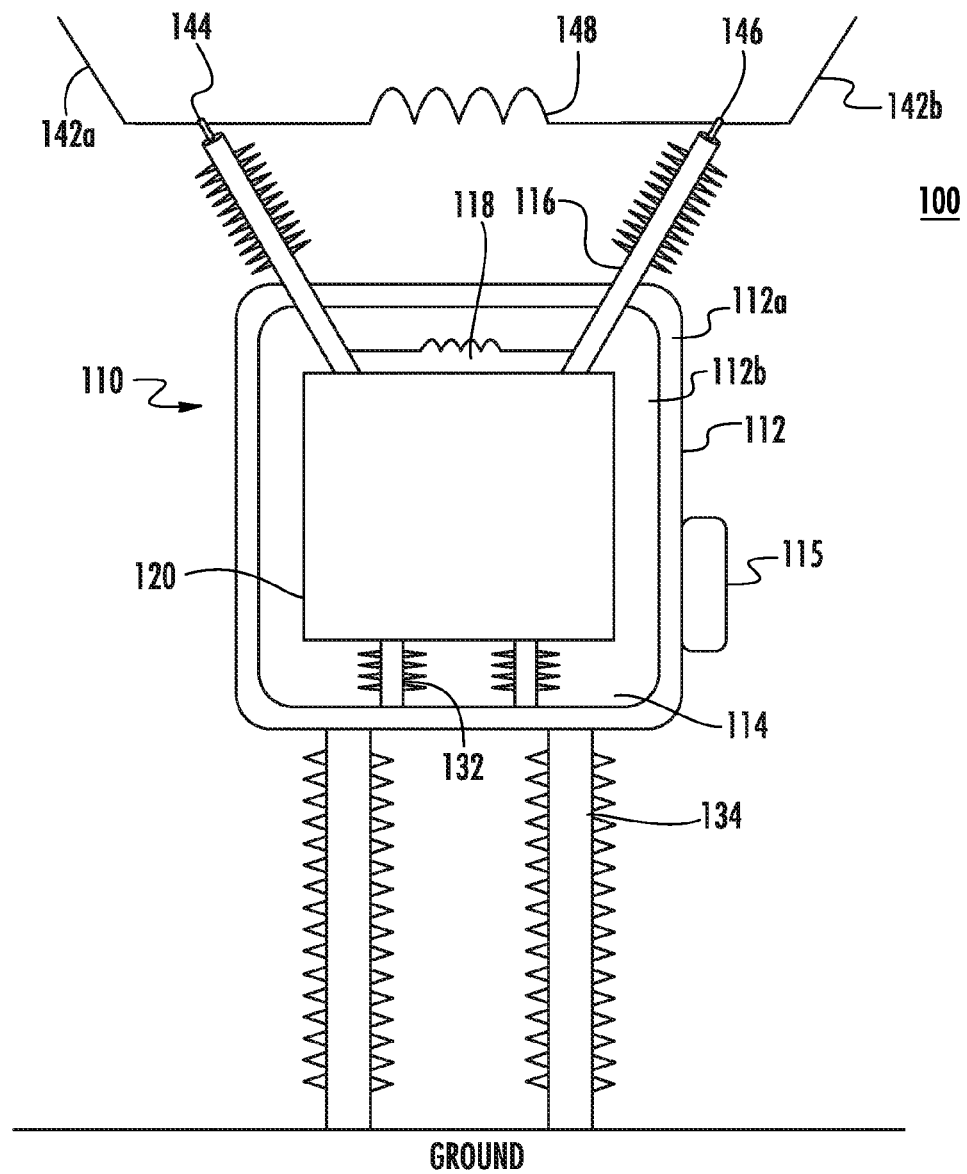
FIG. 1A shows an exemplary superconducting fault current limiting (SCFCL) system according to one embodiment of the present disclosure.
Figure 1B:
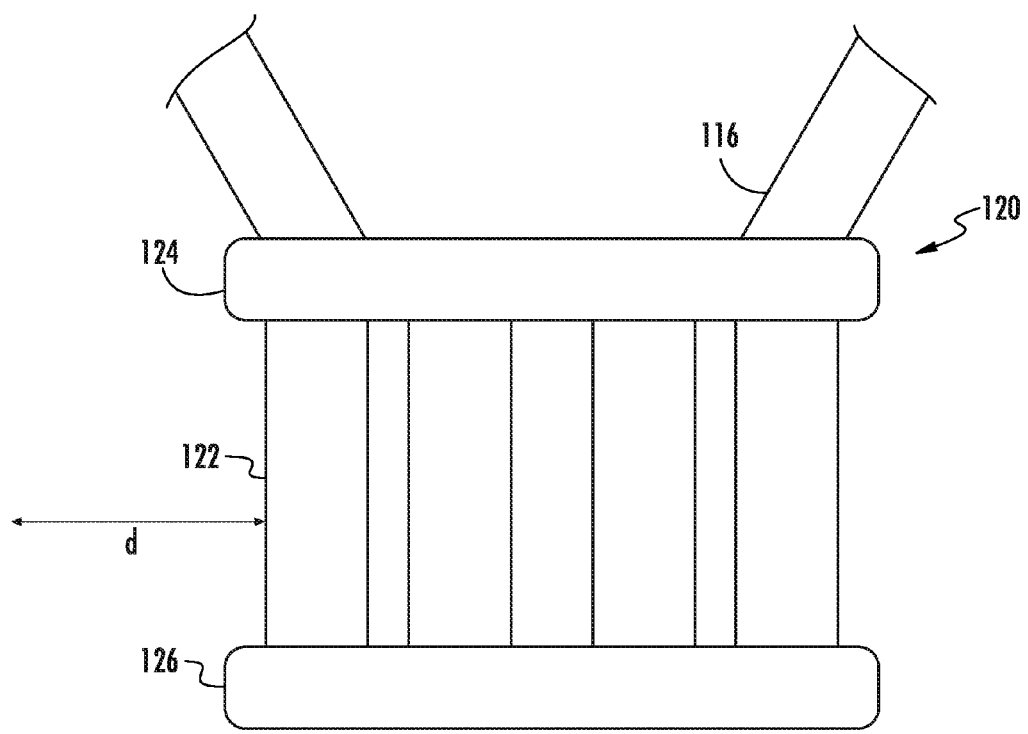
FIG. 1B shows an exemplary fault current limiting units that may be contained in SCFCL system of the present disclosure.

Referring to FIGS. 1A and 1B, there are shown an exemplary superconducting fault current limiting (SCFCL) system 100 according to one embodiment of the present disclosure. In the present embodiment, SCFCL system 100 may comprise one or more modules 110. However, SCFCL system 100 of the present disclosure may contain any number of modules 110. For example, SCFCL system 100 may have three, single phase modules that are identical to one another. The modules may be serially connected or connected in a parallel circuit. For the purposes of clarity and simplicity, the description of SCFCL system 100 will be limited to one single phase module 110.

The module 110 of SCFCL system 100 may comprise an enclosure or tank 112 defining a chamber therein. In one embodiment, the enclosure or tank 112 may be thermally and/or electrically insulating tank 112 such as those made with fiberglass or other dielectric material. In the present embodiment, the tank 112 is a metallic tank 112 comprising an inner and outer layers 112a and 112b, and a thermally and/or electrically insulating medium interposed therebetween.

Within the tank 112, there may be one or more fault current limiting units 120 which, for the purpose of clarity and simplicity, are shown as a block. In the present embodiment, the module 110 may be a single phase module 110 having a single phase fault current limiting unit 120. In another embodiment, the module 110 may be a three phase module having three, single phase fault current limiting units 120. As illustrated in FIG. 1B one or more superconducting circuits 122 and first and second end caps 124 and 126 may be disposed in the fault current limiting units 120. The first and second end caps 124 and 126, in one embodiment, may be corona shields. In the present disclosure, the fault current limiting unit 120 may have a clearance length of 250 cm or less from the tank 112. Preferably, the clearance length may be 8-25 cm. Herein, the clearance length may refer to the shortest distance between the one or more superconducting circuits 122 and the tank 112.

Returning to FIG. 1A, the module 110 may also comprise one or more electrical bushings 116. The bushings 116 may comprise an inner conductive material (not shown) and an outer insulator. The distal end of the bushings 116 may be coupled to a respective current line 142 via terminals 144 and 146 to couple SCFCL module 110 to the transmission network (not shown). The current lines 142 may be transmission lines used to transmit power from one location to another (e.g. current source to current end users), or power or current distribution lines. The inner conductive material in the bushings 116 may connect the terminal 144 and 146 of the bushing 116 to the fault current limiting unit 120. Meanwhile, the outer insulator is used to insulate the enclosure or tank 112 from the inner conductive material, thereby allowing the tank 112 and the terminals 144 and 146 to be at different electrical potentials. If desired, SCFCL module 110 may comprise optional internal shunt reactor 118 or an external shunt reactor 148, or both, to connect the conductive material contained in the electrical bushings 116. However, the present disclosure does not preclude SCFCL module 110 without the internal shunt reactor 118 or an external shunt reactor, or both.

The temperature of one or more fault current limiting units 120 may be maintained at a desired temperature range by coolant 114 contained in the tank 112. In one embodiment, it may be desirable to maintain the fault current limiting units 120 at a low temperature, for example, ~77° K. To maintain at such a low temperature range, liquid nitrogen or helium gas may be used as coolant 114. In other embodiment, it may be desirable to maintain the temperature of the one or more fault current limiting units 120 at other temperature range, and other types of coolant, in gaseous or liquid form, may also be used. For example, it may be desirable to maintain the temperature of the fault current limiting units 120 at a room temperature. In such a case, air maintained at a room temperature may also be used as the coolant 114. When introduced, the coolants 114 may enter the tank 112 via a feed line (not shown) and a port 115 coupled to the tank 112. In the present disclosure, the feed line and the port 115 may preferably be made from thermally and/or electrically insulating material. However, the present disclosure does not preclude any one of the feed line and the port 115 from containing thermally and/or electrically conductive material. If the feed line and the port 115 do not provide grounding of the tank 112 or any component contained therein, they may be made from any type of material.

In the present embodiment, the tank 112 may be supported from the ground by an optional external support 134. Meanwhile, the fault current limiting units 120 may be supported from the tank 112 by an optional internal support 132. Those of ordinary skill in the art may recognize that both of the internal supports 132 may be optional as the fault current limiting units 120 may be supported from the tank 112 by some other components. Even if included, the internal support 132 may support the fault current limiting units 120 from the side or top of the fault current limiting units 120, not necessarily from the bottom. Likewise, the tank 112 may be supported from the ground by some other components. Moreover, if included, the external support 134 may support the tank from the side or top of the tank 112, not necessarily from the bottom of the tank 112.

If included, each of the internal support 132 and the external support 134 may preferably be made from thermally and/or electrically insulating material. However, the present disclosure does not preclude thermally and/or electrically conductive internal support 132 and the external support 134. If thermally and/or electrically conductive external support 134 is used, it may be desirable to provide an electrically insulating material between the support 134 and the ground to electrically isolate the tank 112 from the ground.

SCFCL system 100 having one or more SCFCL modules 110 may be incorporated into the current distribution network. The tank 112 may be either electrically connected to the transmission lines 142. However, the tank 112 may be electrically decoupled from the ground by air, which may act as an insulator, and optionally by the external support 134. As noted above, the tank 112 may be metallic tank 112 in some embodiments. In these embodiments, the tank 112 may typically float at a voltage that is close to the voltage of the terminals 144 and 146. It is contemplated that during normal operation, the voltage of the tank 104 may be approximately the same as the voltage being transmitted on the transmission lines 142 as the voltage at transmission lines 142a, 142b remain nearly identical. During fault, the voltage of the metal tank may be between the voltage at transmission lines 142a and 142b.

During normal operation, current from the transmission line 142 is transmitted through the SCFCL module 110 from the first terminal 144 to the second terminal 146 via the bushings 116 and the fault current limiting unit 120. In the fault current limiting unit 120, the superconducting circuit 122 therein is maintained below critical temperature ($T_C$), critical magnetic field ($H_C$), and critical current ($I_C$) and remains in a superconducting state. The resistance, therefore, may be negligible compared to system impedance. When a fault occurs, the fault current transmitted to the module 110 may cause at least one of the operating parameters, temperature ($T_o$), Magnetic field ($H_o$), and current ($I_o$) of the superconducting circuit 122 to increase above the critical limit $T_C$, $H_C$, or $I_C$. The resistance of the superconducting circuit 122 increases, to decrease the transmission through SCFCL module 110 of fault current to predefined value, preferably about 50%. Limited current using SCFCL may vary from 10% to 90%, depending on the systems operators' specification. After the fault current subsides, the superconducting circuit 122 may return to superconducting state and hence to nearly zero resistance. This process is referred as the recovery cycle.

In the present disclosure, the tank 112 of the module 110 is electrically decoupled from the ground. Moreover, high voltage design challenges may be addressed outside of the module 110 by, for example, air which may act as an electrical insulator. As a result, high voltage bushing design and special high voltage design within the tank 112, which otherwise must be included to operate under high voltage, may be unnecessary. The design of the module 110, therefore, may be simplified. Moreover, the dimension of the module 110 may be much smaller. Even if the tank 112 of the module 110 is made from electrically conductive material, the tank 112 may be maintained at a non-zero electrical potential by, for example, removing the tank 112 from the ground and electrically floating the tank 112 with respect to ground.

The tank 112 may be at a different voltage, based on the amount of electrical isolation between the tank, the network and ground. In some embodiments, the support structures 132 and 134 form a voltage divider between the module 110 and ground and wherein the electrical potential of the tank 112 may be a value above ground and below terminal voltage.

In the present disclosure, the module 110 may preferably have the following exemplary specifications.

Maximum voltage during fault at rated limited fault current=10 kV rms

Maximum load current=1.2 kA rms

Maximum fault current=40 kA rms

Maximum impedance during fault at rated limited fault current=0.25 Ω.

In other words, the impedance of the current limiter module 110 can increase to 0.25Ω during fault conditions. The module 110 can withstand a maximum fault current of 40 kA rms. Based on these values, the maximum voltage potential across the module 110 may be 0.25 Ω*40 kA rms, or 10 kV rms. Knowing these parameters, it is possible to design a variety of transmission networks, which use various system voltages and have maximum fault current less than would otherwise be possible.

If the network requires a 3 phase system having a system voltage of 138 kV, 1200 A, and 63 kA fault transmission line. Based on these characteristics, the following specifications can be calculated:

Phase voltage (which is defined as $$\frac{systemvoltage}{\sqrt{3}})$$

is 80 kV.

The system short circuit impedance is calculated by dividing the phase voltage by the maximum fault current, or $$\frac{80 \text{ kV}}{63 \text{ kA}} = 1.26 \text{ }\Omega$$

The maximum fault current allowed by the SCFCL module is 40 kA. So, the current reduction requirement is at least $$\frac{63 \text{ kA} - 40 \text{ kA}}{63 \text{ kA}},$$

or 37%.

To achieve a maximum fault current of less than 40 kA, the impedance of the network may be greater than $$\frac{80 \text{ kV}}{40 \text{ kA}},$$

or 2Ω.

The number of SCFCL modules can be determined by subtracting the system short circuit impedance (1.26Ω) from the desired impedance (2.0Ω), and dividing this result by 0.25Ω (the impedance of one SCFCL module). Allowing for margin, the number of 10 kV SCFCL units required can be determined to be 4. Based on this, the total SCFCL impedance of all the modules is 4*0.25, or 1.0Ω. The limited fault current is now given by $$\frac{80 \text{ kV}}{1.26 \text{ }\Omega + 1.0 \text{ }\Omega},$$

or 35 kA. The fault current reduction achieved is given by $$\frac{63 \text{ kA} - 35 \text{ kA}}{63 \text{ kA}},$$

or 44%.

Table 1 shows other configurations that can be employed. In the embodiments shown below, the limited current is maintained below 40 kA. The system voltage, and therefore the phase voltage, of each configuration is varied, and the resulting number of SCFL is computed. Based on this, the limited current and % current reduction can be calculated.

TABLE 1

Requirements for various system configurations

| System voltage - Line-to-Line [kV rms] | Phase Voltage [kV rms] | Prospective fault current [kA rms] | System short circuit impedance, Zs [Ohm] | SCFCL Unit voltage [KV rms] | SCFCL unit Impedance [Ohm] | Number of SCFCL units required | Limited current [kA rms] | % Current reduction |
|---|---|---|---|---|---|---|---|---|
| 15 | 9 | 63 | 0.14 | 3.3 | 0.08 | 1 | 39 | 38% |
| 35 | 20 | 63 | 0.32 | 10 | 0.25 | 1 | 35 | 44% |
| 70 | 40 | 63 | 0.64 | 10 | 0.25 | 2 | 35 | 44% |
| 100 | 58 | 63 | 0.92 | 10 | 0.25 | 3 | 35 | 45% |
| 138 | 80 | 63 | 1.26 | 10 | 0.25 | 4 | 35 | 44% |
| 220 | 127 | 63 | 2.02 | 10 | 0.25 | 6 | 36 | 43% |
| 345 | 199 | 63 | 3.16 | 10 | 0.25 | 10 | 35 | 44% |

SCFCL system 100 comprising one or more modules 100 provides many advantages. As noted above, the dimension of the module 110 may be much smaller compare to the dimension of the module that is electrically coupled to the ground. For example, the SCFCL module 110 of the present disclosure may have the clearance length of 250 cm or less. In one embodiment, the clearance length, in one embodiment, may be as small as 8-25 cm. As noted above, the clearance length may be the shortest distance between the one or more superconducting circuits 122 and the tank 112. This may be different from the tank that may be electrically coupled to the ground. In the latter case, the clearance length may be as much as 90 inches.

The large dimension in the latter case may be attributable to an arc path between the superconducting circuit and the tank. During the fault condition, temperature within the tank may increase substantially. If liquid nitrogen is used as the coolant, rise in temperature may cause the liquid nitrogen to form nitrogen gas bubbles. High electric field from the superconducting circuit voltage may cause the bubbles to line up from the superconducting circuit to the tank. As nitrogen gas is a poor electrical insulator compared to liquid nitrogen, the bubbles may provide a weak dielectric path by which arc flashover may occur between the superconducting circuit and the tank. If the tank is maintained at ground potential, the arc path may be formed connecting the superconducting circuit, the tank, and the ground via the bubbles. As a result, high voltage breakdown may occur causing another fault. One way to prevent formation of such a path is to increase the clearance length, thereby decreasing the probability of formation of a complete path between the tank and the superconducting circuit. However, increasing the distance between the tank and the superconducting circuit, necessarily increase the footprint of the SCFCL module. In the present embodiment, the tank, which is maintained above the ground voltage level, may prevent arcing current from flowing from the superconducting circuit to the ground even if bubbles line up from the superconducting circuit to the tank. As such, SCFCL 100 of the present embodiment may prevent additional fault despite smaller footprint, and provides a compact SCFCL device with superior High Voltage performance that is in critical need for power transmission and distribution systems.

Smaller dimension also enables vertically or horizontally oriented modules 110. Herein, vertical and horizontal orientation may refer to the aspect ratio of the height to width of the modules 110. In one embodiment, the modules 110 may be tall and thin modules, thus vertically oriented. In another the modules 110 may be horizontally oriented, having short and wide dimension.

If two or more modules 110 are included in the system 100, the plurality of smaller modules 110 may be coupled in series and/or parallel to customize the design for higher voltages and/or higher current applications. In addition, stringent testing requirements by power utility companies that may require testing SCFCL devices at high voltage during fault conditions can be met by the present module 110, where each module 110 may be tested independently. Maintaining or performing repair work may be done by removing and/or exchanging the used modules 110 with new modules 110. The modules 110 of the present embodiment may be a single phase module 100a. In another embodiment, the module may be a three phase module. The single phase module may have advantages when a transmission line SCFCL is designed. Meanwhile, the three phase module may be used for lower voltage distribution system applications.

Figure 2:
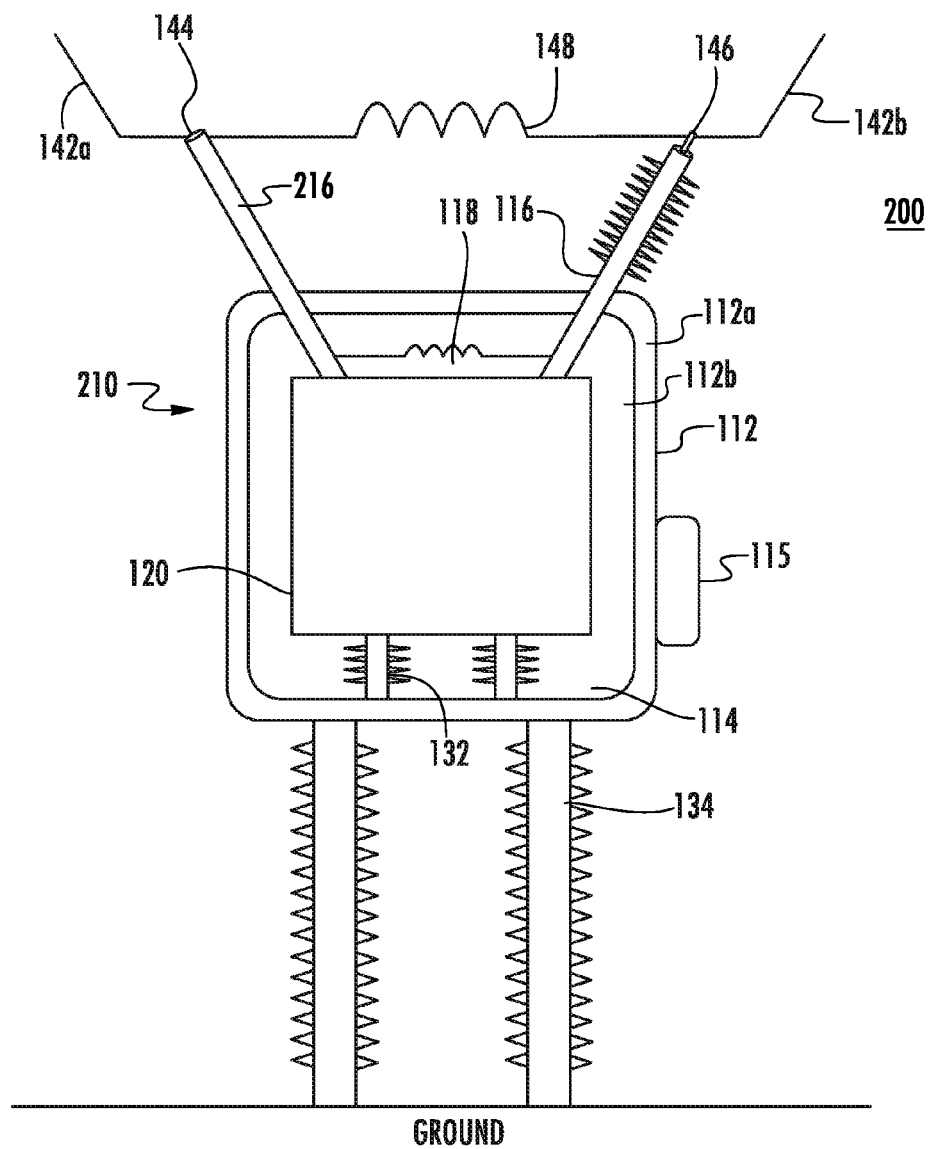
FIG. 2 shows another exemplary SCFCL system according to another embodiment of the present disclosure.

Referring to FIG. 2, there is shown another exemplary SCFCL system 200 according to another embodiment of the present disclosure. It should be appreciated by those of ordinary skill in the art that SCFCL system 200 of the present embodiment is similar to the system 100 of earlier embodiment. In addition, SCFCL system 200 of the present embodiment contains many components that are similar to those included in SCFCL system 100 shown in FIGS. 1A and 1B. As such, figures and the description of SCFCL system 100 of earlier embodiment should also be read along with SCFCL system 200 of the present embodiment.

The module 210, unlike the module 110 of the SCFCL system 100, comprises a conducting rod 216 connecting the fault current limiting unit 120 and the tank 112 to one of the current lines 142a and 142b. As such, the tank 112 may be maintained at the same electrical potential as one of the terminals 144 and 146 during both normal and fault conditions.

Figure 3A:
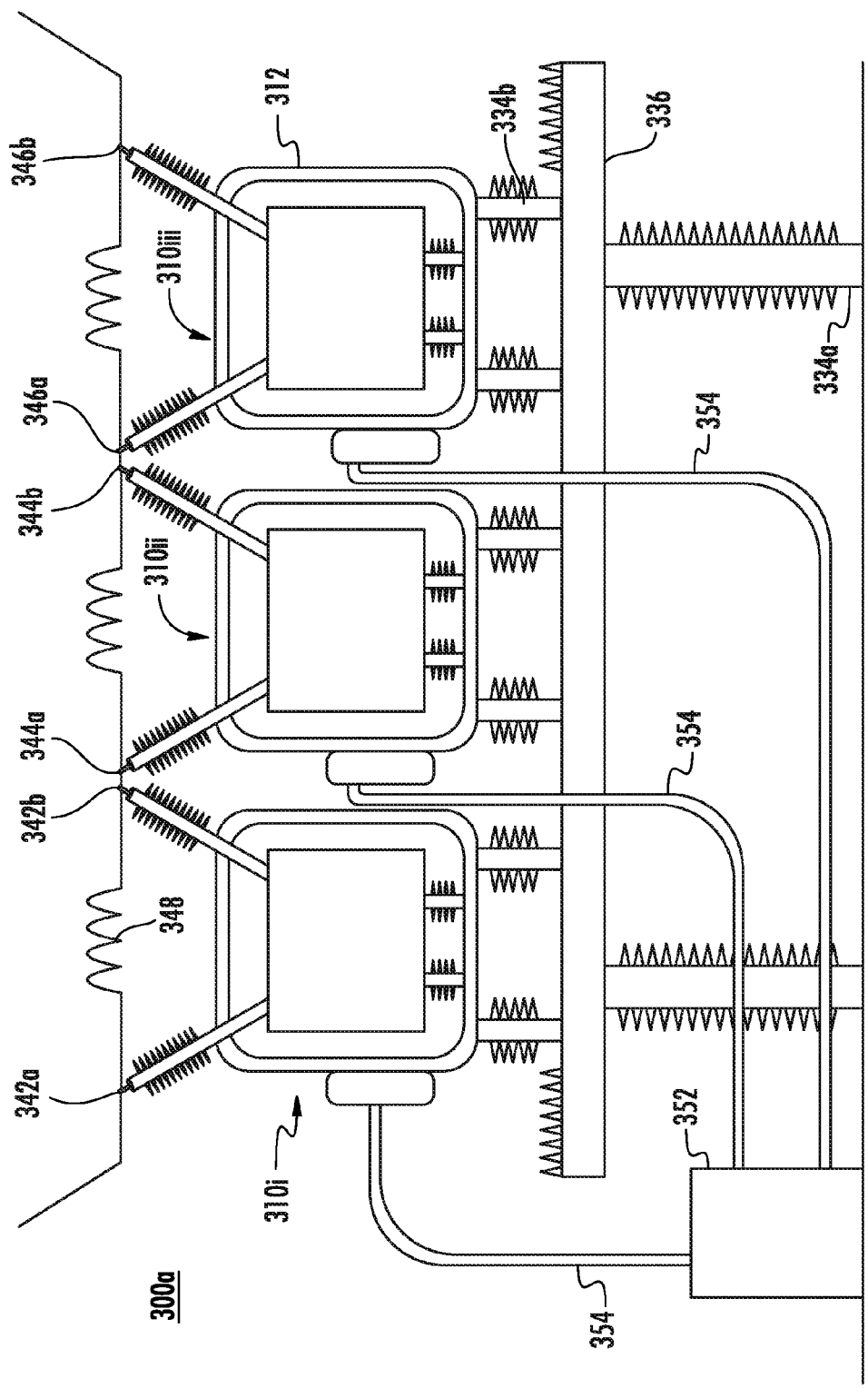
FIG. 3A shows another exemplary SCFCL system according to another embodiment of the present disclosure.

If SCFCL system comprises a plurality of SCFCL modules, the modules may be arranged in various configurations. Referring to FIG. 3A, there is shown another exemplary SCFCL system 300a according to another embodiment of the present disclosure. The apparatus 300a may be SCFCL system comprising a plurality of SCFCL modules 310i-310iii. Those of ordinary skill in the art will recognize that SCFCL system 300a of the present embodiment may contain components that are similar to those disclosed in earlier embodiments. For purpose of clarity, description of similar features will be omitted. As such, the description of SCFCL system 300a of the present embodiment should be read with SCFCL systems of earlier embodiment.

As illustrated in FIG. 3A, SCFCL system 300a of the present embodiment may comprise a plurality of SCFCL modules, preferably, three, single phase SCFCL modules 310i-310iii. Each module 310i-310iii may be similar to each other and to that disclosed in earlier embodiment. If desired, one or more modules 310i-310iii may include internal and/or external shunt reactors. However, the present disclosure does not preclude one or more modules 310i-310iii having no internal and/or external shunt reactors 318 and 348.

The tank 312 of each module 310i-310iii may be spaced apart and electrically decoupled from the ground. If desired, each tank 312 may be supported by electrically and/or thermally insulating supports 334a and 334b and a platform 336. SCFCL system 300 may also comprise coolant supply 352 providing coolant to each tank via coolant feed line 354.

Each module 310i-310iii is a single phase module arranged in series. As such, current may flow through the first module 310i into the second module 310ii and then to the third module 310iii. Such a series configuration can be used to create the configurations shown in Table 1. Similar to the SCFCL module described above, each module 310i-310iii may be horizontally or vertically oriented.

Figure 3B:
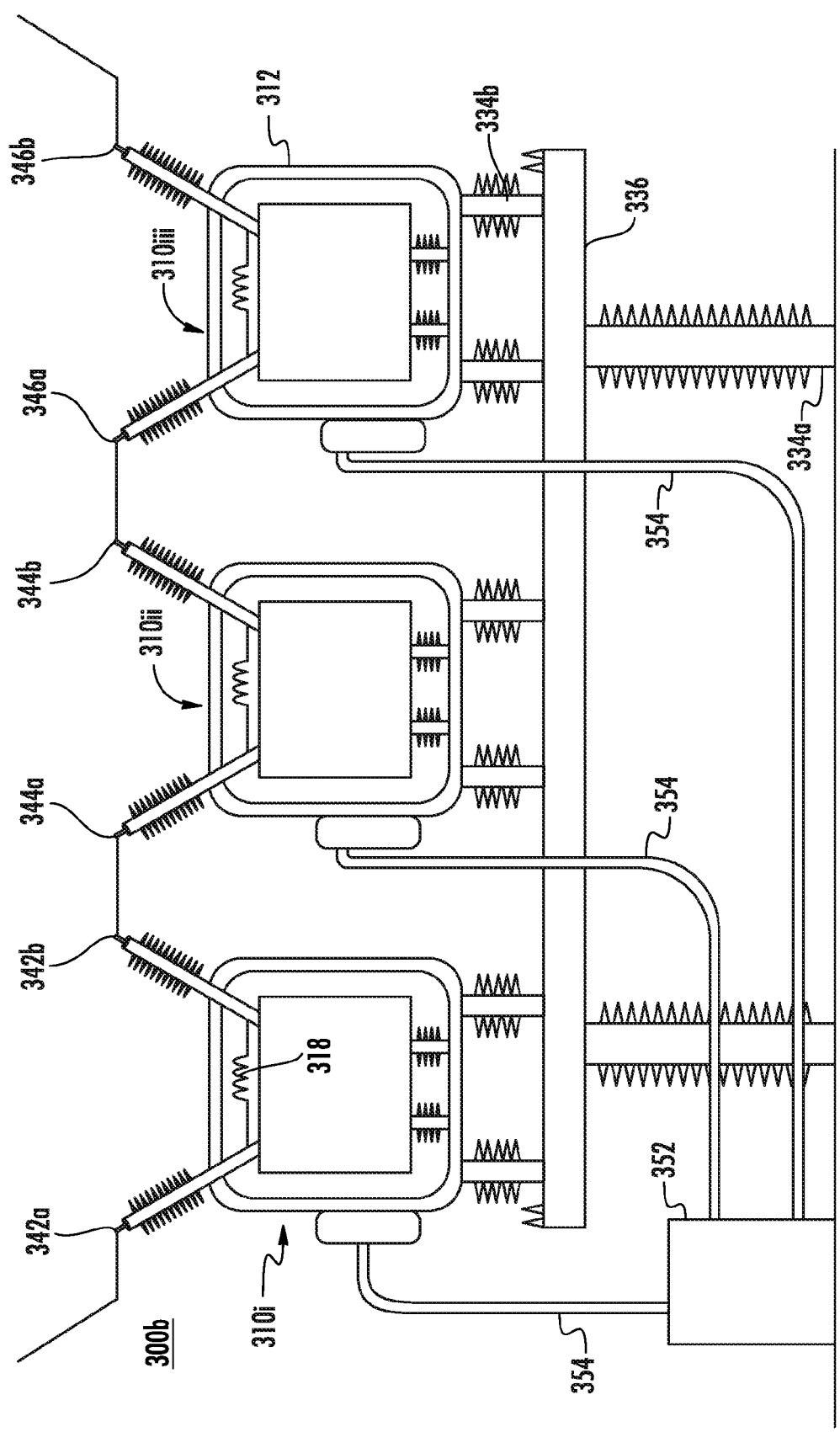
FIG. 3B shows another exemplary SCFCL system using internal shunt reactors according to another embodiment of the present disclosure.
Figure 3C:
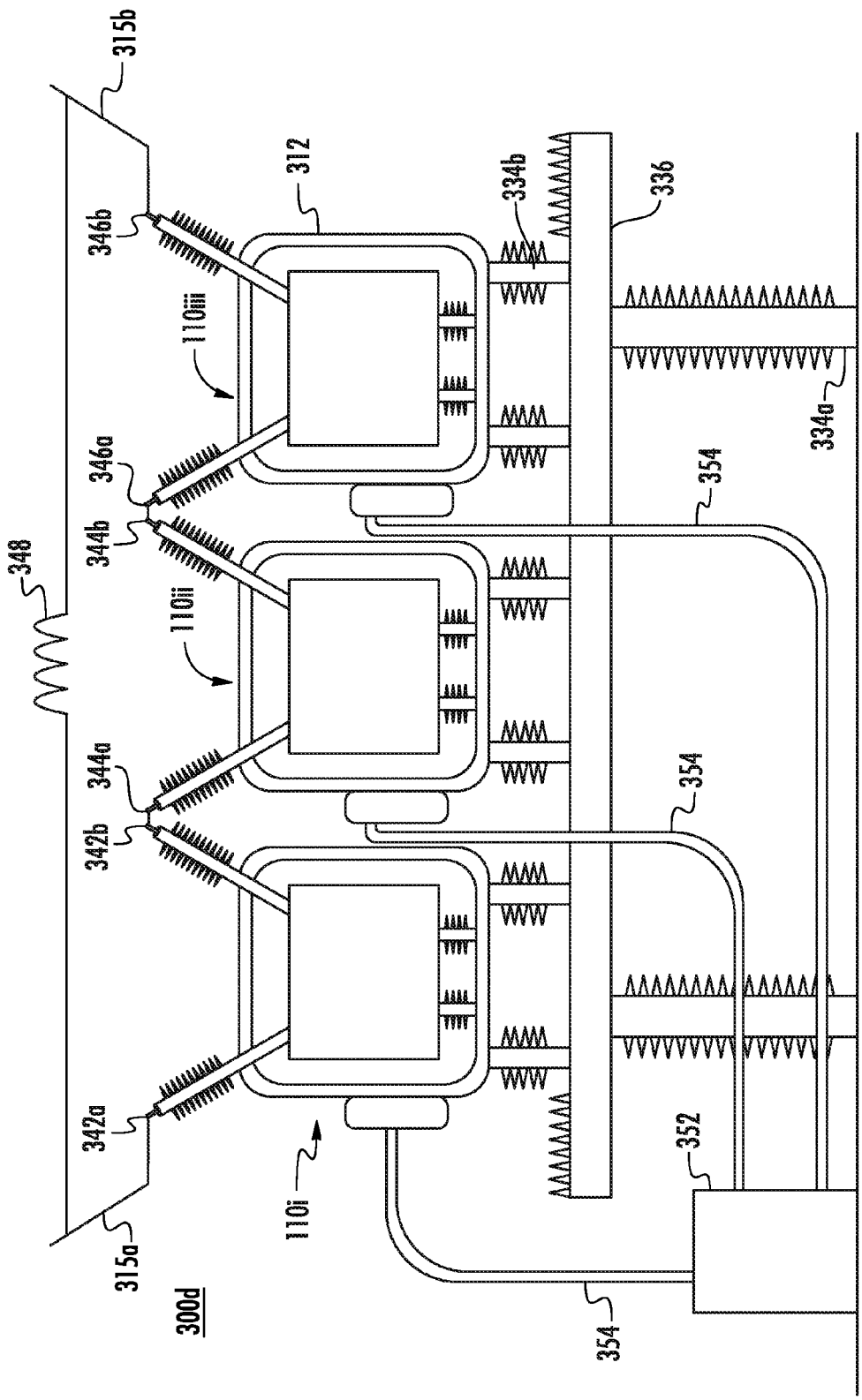
FIG. 3C shows another exemplary SCFCL system using an external shunt reactor according to another embodiment of the present disclosure.

In FIG. 3B, the modules 310i-310iii of another exemplary SCFCL system 300B may be oriented in vertical or horizontal orientation. However, each of the modules 310i-310iii does not contain external shut reactors. Instead, each module 310i-310iii may contain internal shunt reactor. In FIG. 3C, the modules 310i-310iii of yet another exemplary SCFCL system 300d may be oriented in vertical or horizontal orientation. However, a single external shunt reactor 348 is used to connect the current lines 315a and 315b.

Similar to the tanks 112 of SCFCL systems 100 and 200 of earlier embodiments, the tanks 312 of SCFCL system of the present embodiment may be made from conducting material, such as metal, or dielectric material, such as fiberglass. In addition, the tanks 312 are electrically decoupled from ground and/or from the terminals 342a, 342b, 344a, 344b, 346a, and 346b. In the case of electrically conductive tanks 312, the voltage of each tank 312 may float at or about the voltage of the current lines 3215a and 315b during normal operation. In the event of a fault, each tank 312 will tend to float at a voltage between those present at each of its terminals 342a, 342b, 344a, 344b, 346a, and 346b. Since the tanks 312 may be on a common platform 336, insulating supports 334a and 334b may be used to insulate the tanks 312 from one another in the event of a fault, as each tank may tend to float at a different electrical potential.

In other embodiments, the tanks 312 are conductive and each tank 112 is tied to one of its respective terminals 342a, 342b, 344a, 344b, 346a, and 346b. In this case, insulating supports 334b may be used to isolate the tanks 312 from the platform 336 and from one another in the event of a fault, as each will be at a different electrical potential. In one embodiment, one tank may be electrically connected to the platform 336, while the other tanks are electrically isolated therefrom.

Figure 4A:
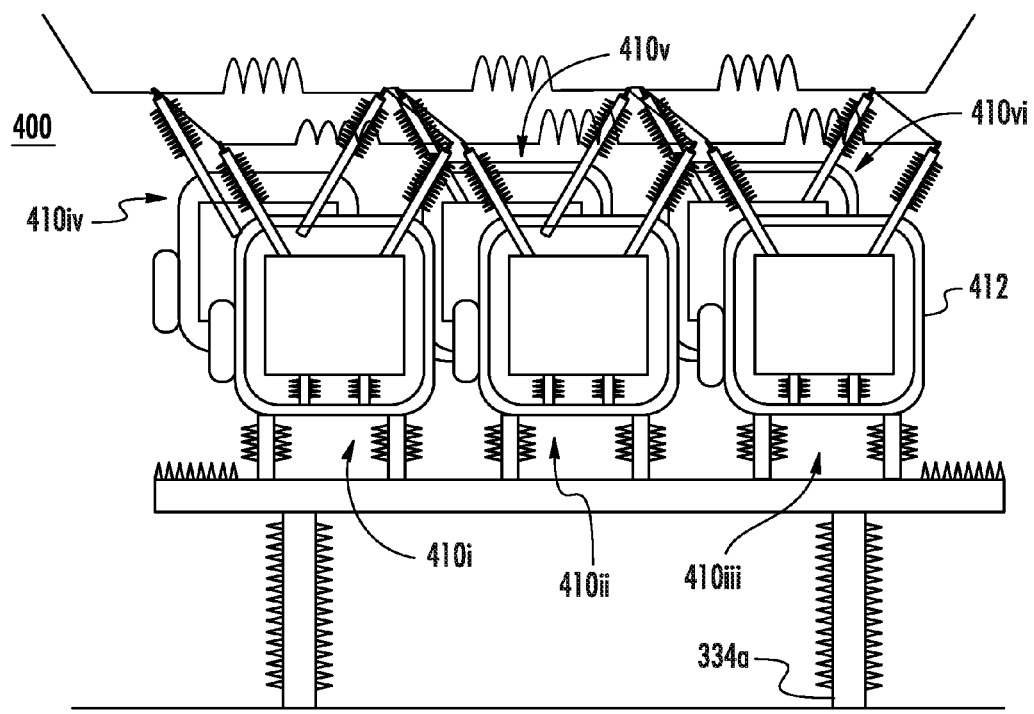
FIGS. 4A and 4B show side view and top view of another exemplary SCFCL system according to another embodiment of the present disclosure.
Figure 4B:
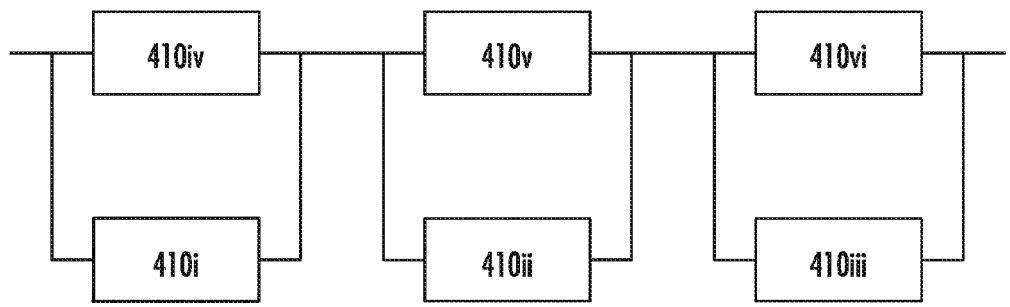

Referring to FIGS. 4A and 4B, there are shown side and top views, respectively, of another exemplary SCFCL system 400 according to another embodiment of the present disclosure. In the present embodiment, SCFCL 400 may comprise first to sixth single phase superconducting current fault limiter modules 410i, 410ii, 410iii, 410iv, 410v, and 410vi. Each of SCFCL modules 410i, 410ii, 410iii, 410iv, 410v, and 410vi may be similar to each of SCFCL modules contained in SCFCL system 100, 200, and 300 of earlier embodiments.

As illustrated in FIG. 4B, SCFCL modules 410i, 410ii, 410iii, 410iv, 410v, and 410vi are arranged in a serial and in parallel connection. For example, the first and fourth SCFCL modules 410i and 410iv may be electrically connected in a parallel connection; the second and fifth SCFCL modules 410ii and 410v may be electrically connected in a parallel connection; and the third and sixth SCFCL modules 410iii and 410vi may be connected in a parallel connection. At the same time, the first and fourth SCFCL module 410i and 410iv are connected to the second and fifth SCFCL modules 410ii and 410v in series, and the second and fifth SCFCL modules 410ii and 410v are connected to the third and sixty SCFCL modules 410iii and 410vi in series. Such a configuration can be used to allow higher currents (due to the parallel configuration) and higher voltages (due to series configuration). Those of ordinary skill in the art will realize that the disclosure is not limited to this specific configuration, as the SCFCL modules 410i, 410ii, 410iii, 410iv, 410v, and 410vi may be arranged in any combination of series and parallel connections. In addition, the number of SCFCL modules is not limited to a particular number.

Figure 5A:
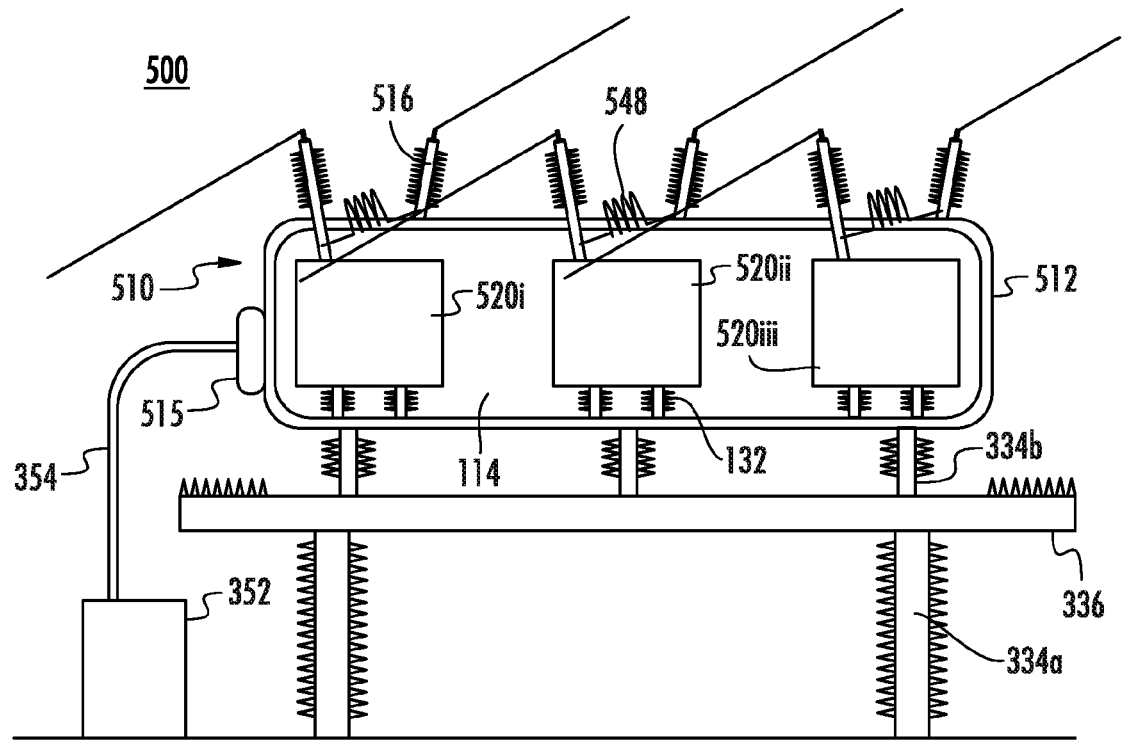
FIGS. 5A and 5B show side view and top view of another exemplary SCFCL system according to another embodiment of the present disclosure.
Figure 5B:
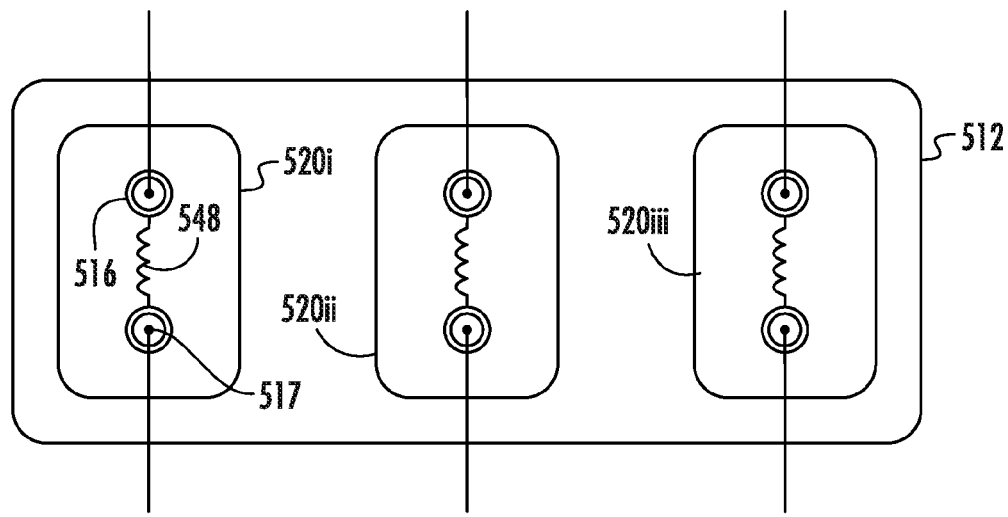

Referring to FIGS. 5A and 5B, there are shown side and top views, respectively, of another exemplary SCFCL system 500 according to another embodiment of the present disclosure. In the present embodiment, SCFCL 500 comprises a SCFCL module 510. SCFCL module 510 of the present embodiment may comprise a tank 512 made from a thermally and/or electrically insulating material such as, for example, fiberglass or G10. However, a conductive tank 512 such as, for example, a metallic tank 512 is not precluded in the present disclosure. Even if the tank 512 is made from electrically conducting material, the tank 512 may be electrically isolated and decoupled from ground. In some embodiments, the tank 512 is isolated from all of the terminals 517a-517f, while in other embodiments, it may be electrically coupled to exactly one of the terminals 517.

In the tank 512, a plurality of SCFCL units 520i, 520ii, and 520iii are disposed. Each of SCFCL units 520i, 520ii, and 520iii may be similar to SCFCL units described in earlier embodiments. In addition, SCFCL units 520i, 520ii, and 520iii of the present embodiment may be arranged in one or more configurations similar to those described in earlier embodiments. Each unit 520i, 520ii, and 520iii may be a single phase unit, and, preferably, the phase of each unit 520i, 520ii, and 520iii may different from the phase of adjacent unit 520i, 520ii, and 520iii. For example, the unit 520i may have a phase different from the unit 520ii. Meanwhile, the unit 520i may have a phase that is the same or different from the phase of the unit 520iii. In some embodiments, 3 modules are included within the tank 512, where each is one phase of a 3-phase power system. In this embodiment, each phase is offset from each of the other two by 120°. In addition, SCFCL units 520i, 520ii, and 520iii may be arranged in a vertical orientation or horizontal orientation.

The temperature of the superconducting fault current limiting units 520i, 520ii, and 520iii may be maintained at a desired temperature. For example, the superconducting fault current limiting units 520i may be maintained at a low temperature (such as ~77 k) by a coolant 114 such as, for example, liquid nitrogen or another coolant 114 (in gaseous or liquid form) introduced to the tank 512. When introduced, the coolant 113 may enter the tank 512 via a feed line 354 and a port 515 coupled to the tank 512. Similar to the earlier embodiment, the feed line and the port may be insulating feed line; although, a conductive feed line is not precluded in the present disclosure.

Each of SCFCL units 520i, 520ii, and 520iii is also coupled to electrical bushings 516. The electrical bushings 516 of each unit may be coupled to one another by an internal shunt reactor (not shown). Alternatively, the bushings 516 may be coupled to one another via an external shunt reactor 548 as SCFCL of earlier embodiments. Yet in another embodiment, SCFCL module 520i may comprise both the internal and external shunt reactors, and the bushings 516 of each SCFCL units 520i, 520ii, and 520iii may be coupled to one another via both internal and external shunt reactors. In addition, the bushing 516 may be coupled to the current line at terminals 517, thus coupling SCFCL system 500 to the transmission network (not shown).

Each of SCFCL units 520i, 520ii, and 520iii may be supported by optional internal supports 132. Meanwhile, SCFCL tank 512 may be supported by one or more optional external support 334a and 334b. To accommodate larger size of SCFCL system 500 of the present embodiment, an optional platform 336 may also be included. Much like SCFCL systems of earlier embodiment, the internal and external supports 132 and 334a and 334b and the platform 336, if included, may be thermally and/or electrically insulating based structures. However, thermally and/or electrically conductive structures, much like the tank 512 and the feed line 354, are not precluded in the present disclosure.

The superconducting fault current limiter 500 of the present embodiment may provide several advantages. For example, most of the high voltage design requirements are moved to an external support structures in air and air gap insulation. In addition, SCFCL 500 requires shorter internal gap between the units 520i, 520ii, and 520iii in the tank 512, and shorter and lower voltage rated bushings 516. Further, providing three phase module may remove redundancy in space utilization that may be present in providing three single phase modules. In particular, the overall dimension of SCFCL may become more compact and light. Such SCFCL system 500 may be attractive where smaller footprint is desired. In addition, SCFCL system 500 may be a part of a device level modular design. Such modules may be used to configure a larger unit by connecting the units in parallel and/or series for higher current and higher voltage applications.

Figure 6:
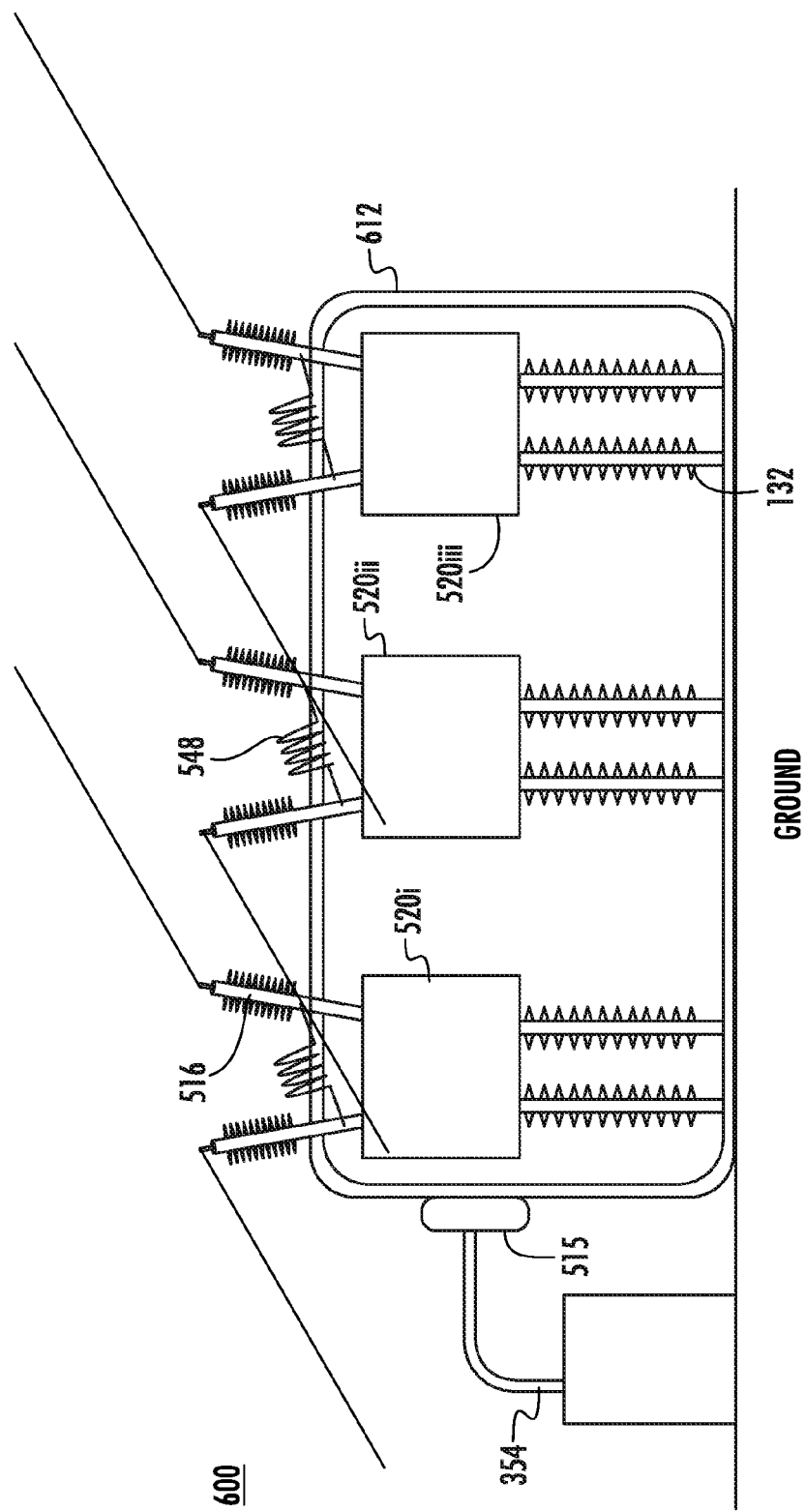
FIG. 6 shows another exemplary SCFCL system according to another embodiment of the present disclosure.
Figure 7:
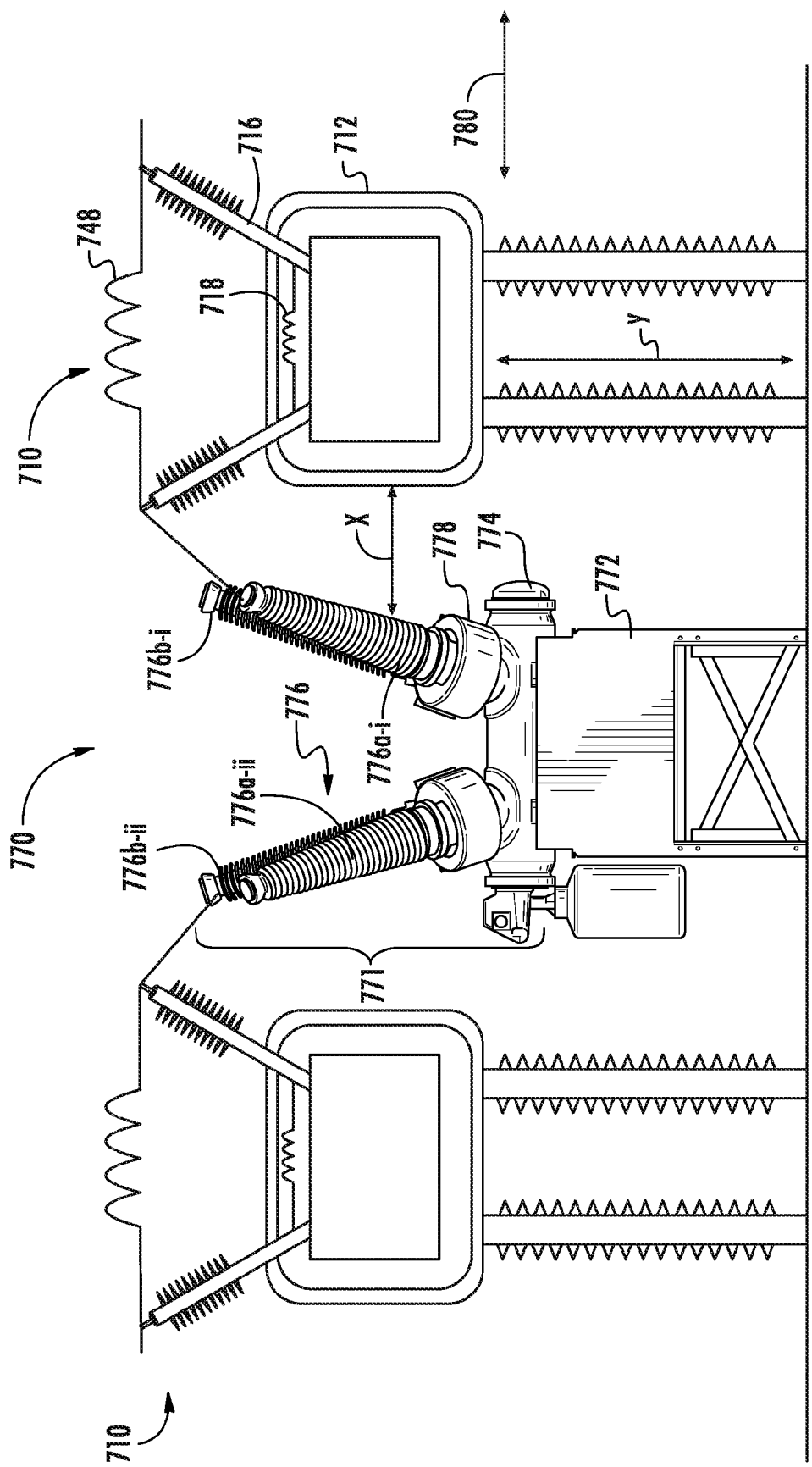
FIG. 7 shows another exemplary SCFCL system according to another embodiment of the present disclosure.

Referring to FIG. 6, there is shown another exemplary SCFCL system 600 according to another embodiment of the present disclosure. SCFCL system 600 is similar to the SCFCL system shown in FIG. 5. However, the tank 612 in the SCFCL system 600 of the present embodiment is much larger. In addition, the tank 612 is electrically conductive, and electrically coupled to the ground. As such, the tank 612 is maintained at a ground potential. Support 132 may optionally provide electrical isolation between the tank 612 and the units 520i-520iii Referring to FIG. 7, there is shown another exemplary SCFCL system 700 according to another embodiment of the present disclosure. In the present embodiment, the SCFCL system 700 is a three-phase system, comprising three, single phase modules 710. In addition, the system 700 is provided near a circuit breaker 770. Although the SCFCL system 700 of the present embodiment comprises three, single phase modules 110, only two modules 710 are shown for the purposes of clarity and simplicity.

The circuit breaker 770 adjacent to the SCFCL systems 700 may include a housing 772 and a tank assembly 771. As illustrated in the figure, the housing 772 may be spaced apart from the ground by a first vertical distance $y_1$. The tank assembly 771, meanwhile, may comprise first cylindrical tank 774. Although not shown, the tank assembly 771 may include second and third cylindrical tanks. The tank assembly 771 may also include plurality of bushing insulators 776. Depending on the type of the circuit breaker 770, the number of bushing insulators 776 may vary. For example, a three-phase circuit breaker 770 may comprise a pair of first phase bushing insulators 776a-i and 776a-ii, a pair of second phase bushing insulators 776b-i and 776b-ii, and a pair of third phase bushing insulators (not shown). Coupled to each bushing insulators, there may be a plurality of current transformers 778.

As noted above, the SCFCL system 700 of the present embodiment is a three-phase system, comprising three, single phase modules 710. The first module 710 may be connected to one of the first phase bushing insulator pair 776a-i and 776a-ii; the second module 710 may be coupled to one of the second phase bushing insulators 776b-i and 776b-ii; and the third module (not shown) may be coupled to one of the third phase bushing insulators (not shown).

Each of the SCFCL modules 710 of the present embodiment may be similar to the SCFCL module 110 of SCFCL system shown in FIG. 1. For example, each module 710 of the present embodiment may comprise a tank 712 that may be spaced apart from the ground and maintained at non-ground potential. As illustrated in the figure, the tank 712 may be spaced apart from the ground by a second vertical distance $y_2$. In addition, the tank 712 are spaced apart from the circuit breaker 770 along the horizontal direction 780 by a lateral distance x.

Within the tank 712, there may be one or more fault current limiting units 720. Further, each module 710 may comprise one or more bushings 716, and one or more of optional internal or external shunt reactors 718 and 748. As each module 710 of the present embodiment may be similar to the module 110 described in FIG. 1, additional description will be omitted.

The SCFCL system 700 of the present embodiment may be positioned proximate to the circuit breaker 770. Preferably, the tank 712 of each module 710 may be positioned above the housing 772 or other parts of the circuit breaker 770 that are maintained at ground potential. For example, the tanks 712 may be either aligned with the bushing insulators 776a-i, 776a-ii, 776b-i, 776b-ii, etc. . . . , along the horizontal direction 780, or positioned above them. As such, the second vertical distance $y_2$ may be greater than the first vertical distance $y_1$. By positioning the tank 712 near or above the bushing insulators 776a-i, 776a-ii, 776b-i, 776b-ii, etc. . . . , the space above the circuit breaker 770 may be utilized.

In addition, the lateral spacing x between the tank 712 and the circuit breaker 770 may be minimized. By aligning the tank 712 with the bushing insulators 776a-i, 776a-ii, 776b-i, 776b-ii, etc. . . . , or positioning above them, space between the tank 712 and the housing 772 may be extended even if the lateral spacing x is decreased. For example, the spacing between the tank 712 and the housing 772 may be extended along the vertical direction. In the process, adequate electrical isolation may be provided to the tank 712 and the housing 772 by the air. The SCFCL system 700 and the circuit breaker 770, therefore, may be more closely packed along the lateral direction 780, and the footprint requirement may be minimized without compromising the electrical isolation.

In the SCFCL system having the tank maintained at the ground potential, the tank normally contacts the ground. In such a system, the lateral distance x between the circuit breaker 770 and the tank must be greater to provide adequate electrical isolation. The system and the circuit breaker 770, therefore, requires greater footprint.

Several embodiments of an apparatus for limiting fault current are disclosed. Those of the art will recognize that the present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for limiting transmission of fault current, the apparatus comprising:
    a first enclosure electrically decoupled from ground, such that said first enclosure is electrically isolated from ground potential;
    first and second terminals, at least one of which is electrically connected to one or more current carrying lines;
    a first superconducting circuit contained in said enclosure, said first superconducting circuit electrically connected to said first and second terminals;
    a platform upon which said enclosure is supported, wherein said platform is electrically isolated from ground;
    a second enclosure;
    third and fourth terminals; and
    second superconducting circuit contained in said second enclosure, said second superconducting circuit electrically connected to said third and fourth terminals,
    wherein said second enclosure is supported by said platform, and
    wherein said third terminal is electrically connected to one of said first and second terminals.

2. The apparatus of claim 1, wherein said first enclosure comprises electrically insulating material.

3. The apparatus of claim 1, wherein said first enclosure is electrically conductive.

4. The apparatus of claim 1, wherein said first enclosure is electrically isolated from said first and second terminals.

5. The apparatus of claim 4, wherein a first voltage is present at said first terminal and a second voltage is present at said second terminal and wherein said first enclosure is at a voltage between said first and second voltages.

6. The apparatus of claim 1, wherein said first enclosure is electrically connected to one of said first and second terminals.

7. The apparatus of claim 1, further comprising a support, for supporting said first enclosure, positioned between said first enclosure and ground, wherein said support electrically isolates said first enclosure from ground.

8. The apparatus of claim 1, further comprising a coolant within said first enclosure to maintain said superconducting circuit below a predetermined temperature.

9. The apparatus of claim 1, further comprising supports between said first enclosure and said platform, such that said first enclosure and said second enclosure are electrically isolated.

10. The apparatus of claim 1, wherein said third and fourth terminals are each electrically connected to one or more current distribution lines.

11. The apparatus of claim 1,
    wherein at least one of said third and fourth terminals is electrically connected to one or more current carrying lines; and 12. The apparatus of claim 11, further comprising:
    fifth and sixth terminals, at least one of which is electrically connected to one or more current carrying lines; and a third superconducting circuit contained in said enclosure, said third superconducting circuit electrically connected to said fifth and sixth terminals.

13. The apparatus of claim 1, wherein clearance length between the first superconducting circuit and the enclosure is less than 250 cm.

14. The apparatus of claim 12, wherein the clearance length between the first superconducting circuit and the enclosure is about 8-25 cm.

* * * * *